United States Patent [19]

Iden et al.

[11] Patent Number: 4,667,036
[45] Date of Patent: May 19, 1987

[54] CONCENTRATION OF LIGHT OVER A PARTICULAR AREA, AND NOVEL PERYLENE-3,4,9,10-TETRACARBOXYLIC ACID DIIMIDES

[75] Inventors: Ruediger Iden, Speyer; Guenther Seybold, Neuhofen, both of Fed. Rep. of Germany

[73] Assignee: BASF Aktiengesellschaft, Ludwigshafen, Fed. Rep. of Germany

[21] Appl. No.: 642,209

[22] Filed: Aug. 20, 1984

[30] Foreign Application Priority Data

Aug. 27, 1983 [DE] Fed. Rep. of Germany ....... 3330916

[51] Int. Cl.$^4$ .......................................... C07D 471/06
[52] U.S. Cl. ............................................... 546/37
[58] Field of Search ................................. 546/37

[56] References Cited

U.S. PATENT DOCUMENTS 4,431,806 2/1984 Spietschka et al. ............... 546/37
4,492,648 1/1985 Claussen ........................ 546/37 X

FOREIGN PATENT DOCUMENTS 61092  9/1982 European Pat. Off. .............. 546/37
2139690 2/1973 Fed. Rep. of Germany ........ 546/37
2148225 4/1973 Fed. Rep. of Germany ........ 546/37
3018006 11/1981 Fed. Rep. of Germany ........ 546/37
3235526 3/1984 Fed. Rep. of Germany .

Primary Examiner—Donald G. Daus
Assistant Examiner—William A. Teoli, Jr.
Attorney, Agent, or Firm—Oblon, Fisher, Spivak, McClelland & Maier

[57] ABSTRACT

Light is concentrated in plastic sheets by a method in which the fluorescent centers used are perylenetetracarboxylic acid diimides of the formula

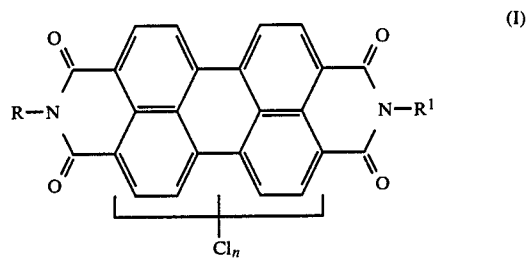

(I)

The compounds (I) are prepared by chlorinating (I) in which n is 0 with sulfuryl chloride in an inert organic liquid in the presence of a catalyst. In the formula, n is 2, 3, 4 or 5 or 6, and R and $R^1$ independently of one another are each (a) straight-chain or branched $C_1$–$C_{18}$-alkyl which is unsubstituted or substituted by cyano, hydroxyl, cycloalkyl, alkylcarbonyloxy, alkenylcarbonyl-oxy or cycloalkylcarbonyloxy and in which the alkyl chain may furthermore be interrupted by O or S, or (b) $C_5$–$C_{18}$-cycloalkyl which is unsubstituted or substituted by alkyl, carboalkoxy or trifluoromethyl.

Novel perylenetetracarboxylic acid diimides of the formula I, where n is 4 and R and $R^1$ are each 3-(2'-ethylhexyloxy)-propyl, 2-ethylhexyl, butyl, octyl, tridecyl, octadecyl, pinan-3-ylmethyl, 6-(2'-ethylhexanoyloxy)-6-methylhept-2-yl, 4-methylcyclohexyl, 3,5-dimethylcyclohexyl, 2,6-dimethylcyclohexyl, 2,6-diisopropylcyclohexyl or norbornyl, or R is $C_4$–$C_{12}$-alkyl, $C_1$–$C_4$-alkyl-substituted cyclohexyl or cyclohexyl-$C_1$- or $C_2$-alkyl, and $R^1$ is 2-hydroxyethyl, $C_1$–$C_{19}$-alkylcarbonyloxy-$C_2$–$C_4$-alkyl, $C_6$–$C_{12}$-cycloalkylcarbonyloxy-$C_2$–$C_4$-alkyl or $C_2$–$C_4$-alkenylcarbonyloxy-$C_2$–$C_4$-alkyl.

The dyes (I) give lightfast fluorescent colorations in plastics.

3 Claims, No Drawings

CONCENTRATION OF LIGHT OVER A PARTICULAR AREA, AND NOVEL PERYLENE-3,4,9,10-TETRACARBOXYLIC ACID DIIMIDES

The present invention relates to a method of concentrating light by means of fluorescent compounds in plastic sheets or films, and novel perylene-3,4,9,10-tetracarboxylic acid diimides.

German Laid Open Applications DOS No. 3,001,857, DOS No. 2,620,115 and DOS No. 2,554,226 disclose apparatuses in which visible light in a plastic sheet can be concentrated over a small area by means of incorporated fluorescent centers.

Particularly where light energy is converted to electrical or thermal energy, the compounds required as fluorescent centers in these apparatuses must be very lightfast, so that the apparatus has a sufficiently long life for the particular application, ie. the compounds used as fluorescent centers must have high lightfastness in the plastics used.

Although it is known that chlorinated bisimides of perylene-3,4,9,10-tetracarboxylic acid meet the above requirements to a large extent, the conventional chlorinated perylene tetracarboxylic acid diimides prepared by chlorination with elemental chlorine in nitrobenzene or chlorosulfonic acid are obtained in very impure form. In order to obtain products suitable for the stated purpose, the chlorination products have to be purified by expensive operations, for example extraction, chromatography or crystallization, these measures, as a rule, having to be repeated a number of times. In particular, a combination of a number of the stated measures may have to be employed.

Furthermore, the choice of substituents at the imide nitrogen, which have a substantial effect on the solubility of the imide in the medium used, is restricted to simple aromatic and aliphatic radicals.

Another disadvantage is that, particularly where chlorination is carried out with elemental chlorine in sulfuric acid, large amounts of highly chlorinated perylimides are formed which, as a rule, are only weakly fluorescent.

It is an object of the present invention to provide compounds which are suitable as fluorescent centers for the conventional apparatuses for light concentration, possess high fluorescence, have high solubility and good lightfastness in the medium used, and do not have any adverse effect on the medium.

We have found that this object is achieved, and that excellent results are obtained in the concentration of light over a particular area with the aid of fluorescent centers in plastic sheets or films, if the fluorescent centers employed are perylene-3,4,9,10-tetracarboxylic acid diimides of the general formula (I)

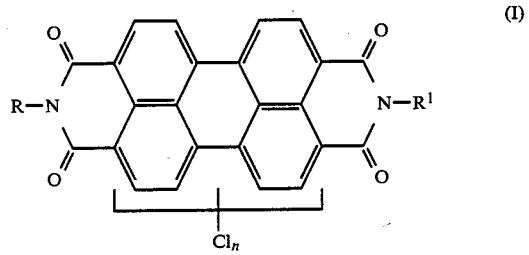

(I)

where n is 2, 3 or 4 and R and $R^1$ independently of one another are each (1) linear or branched $C_4$–$C_{18}$-alkyl where the carbon chain may be interrupted by one or more —O— or —S— atoms, and the —O— and/or —S— atoms are separated by not less than 2 carbon atoms, (2) $C_2$–$C_{18}$-alkyl which is substituted by hydroxyl, cyano, $C_1$–$C_{19}$-alkylcarbonyloxy, $C_2$–$C_4$-alkenylcarbonyloxy or $C_6$–$C_{12}$-cycloalkylcarbonyloxy, (3) $C_1$- or $C_2$-alkyl which is substituted by $C_5$–$C_{18}$-cycloalkyl, or (4) $C_5$–$C_{18}$-cycloalkyl which is unsubstituted or substituted by 1 to 5 $C_1$–$C_4$-alkyl radicals, by 1 or 2 carbo-$C_1$–$C_4$-alkoxy radicals or by 1 or 2 trifluoromethyl radicals, and the $C_5$–$C_{18}$- or $C_6$–$C_{18}$-cycloalkyl radicals can contain 1 to 6 rings, the perylimide (I) being obtained by chlorination of a chlorine-free diimide with sulfuryl chloride in an inert solvent in the presence of iodine and/or iodobenzene.

When employed in the plastics used for the production of the sheets or films required for the concentration of light, the chlorinated perylenetetracarboxylic acid diimides used according to the invention give very lightfast colorations which convert the incident light to fluorescent light with high efficiency. The wavelength of the fluorescent light is from 500 to 600 nm.

The perylimides I used according to the invention have the advantage that in most cases a simple purification operation is sufficient to obtain them in very high purity and, for example, free from weakly fluorescent, highly chlorinated, unstable compounds. Using the stated chlorination process, perylimides possessing sensitive groups which impart high solubility in polymers can be converted to defined chlorine compounds, the chlorine atoms entering the perylene system. The process gives compounds which are substituted in the perylene radical by chlorine and which exhibit a well defined substitution pattern. For example, the tetrachloroperylene-3,4,9,10-tetracarboxylic acid diimides (formula I, wher n is 4) are of the formula

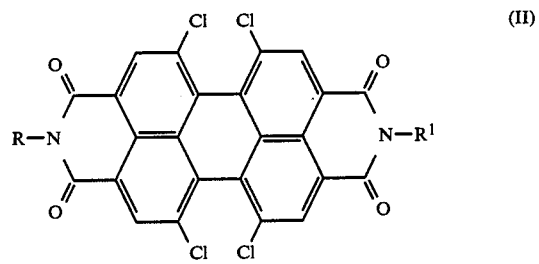

(II)

Suitable unsubstituted or substituted alkyl or cycloalkyl radicals R and $R^1$ are:

(1) Linear or branched $C_4$–$C_{18}$-alkyl where the carbon chain may be interrupted by one or more —O— or —S— atoms, and the —O— and/or —S— atoms are separated by not less than 2 carbon atoms, (2) $C_2$–$C_{18}$-alkyl which is substituted by hydroxyl, cyano, $C_1$–$C_{19}$-alkylcarbonyloxy, $C_2$–$C_4$-alkenylcarbonyloxy or $C_6$–$C_{12}$-cycloalkylcarbonyloxy, (3) $C_1$- or $C_2$-alkyl which is substituted by $C_5$–$C_{18}$-cycloalkyl, or (4) $C_5$–$C_{18}$-cycloalkyl which is unsubstituted or substituted by 1 to 5 $C_1$–$C_4$-alkyl radicals, by 1 or 2 carbo-$C_1$–$C_4$-alkoxy radicals or by 1 or 2 trifluoromethyl radicals, and the $C_5$–$C_{18}$- or $C_6$–$C_{18}$-cycloalkyl radicals can contain 1 to 6 rings.

For reasons relating to performance characteristics, preferred perylimides of the formula I are those in which R and $R^1$ independently of one another are each (1.1) linear or branched $C_4$–$C_{18}$-alkyl in which the alkyl chain may be interrupted by 1 to 5 —O— atoms, (2.1) $C_2$–$C_{12}$-alkyl which is substituted by $C_1$–$C_{19}$-alkylcarbonyloxy, $C_2$–$C_4$-alkenylcarbonyloxy or $C_6$–$C_{12}$-cycloalkylcarbonyloxy, (3.1) $C_1$- or $C_2$-alkyl which is substituted by $C_5$–$C_{18}$-cycloalkyl, or (4.1) $C_5$–$C_{18}$-cycloalkyl which is unsubstituted or substituted by 1, 2, 3 or 4 $C_1$–$C_3$-alkyl radicals, in particular by 1, 2, 3 or 4 methyl or ethyl radicals, or by 1 or 2 trifluoromethyl radicals, and the cycloalkyl radicals stated under (2.1), (3.1) and (4.1) can contain 1 to 3 rings.

Specific examples of substituents R and $R^1$ are:

(1a) $C_4$–$C_{18}$-alkyl: n-butyl, n-pentyl, neopentyl, n-hexyl, 2,3-dimethylbutyl, n-heptyl, 3-methylhexyl, 5-methylhex-2-yl, n-octyl, oct-2-yl, 2-ethylhexyl, n-nonyl, dec-1-yl, dec-2-yl, 8-methylnon-2-yl, 2,8-dimethyl-oct-2-yl, undec-1-yl, dodec-1-yl, tridec-1-yl, tetradec-1-yl, hexadec-1-yl and octadec-1-yl, (1b) $C_4$–$C_{18}$-alkyl in which 1 to 5 carbon atoms are replaced by —O— and/or —S—: $H_3C$—$(OCH_2$—$CH_2$-$)_4$—, $H_5C_2$—$(OCH_2$—$CH_2)_4$—, $H_3C$—$(OCH_2$—$CH_2$-$)_2$—, $H_3C$—$(OCH_2$—$CH_2)_3$—, $H_5C_2$—$(OCH_2$—$CH_2$-$)_3$—, $H_5C_2$—$(OCH_2$—$CH_2)_2$—, $H_9C_4$—$(O$—$CH_2CH_2$-$)_2$—, $H_9C_4$—$(OCH_2$—$CH_2)_3$—, $H_9C_4$—$(OCH_2$—$CH_2$-$)_4$—, 3-(2'-ethylhexyloxy)-prop-3-yl and dodecylthioethyl, (2) 2-(2'-ethylhexanoyloxy)-ethyl, 2-methacryloyloxyethyl, 2-stearyl(=n-octodecanoyl)oxyethyl, 3-hydroxy-2,2-dimethylprop-1-yl, 3-cyanoprop-2-yl, 3-cyano-2-methylprop-2-yl, 1-stearyloxy-2,2-dimethyl-prop-1-yl, 4-(3'-heptanoyloxy)-but-1-yl, 4-stearyloxybut-2-yl, 2,3-dimethyl-4-stearyloxybut-2-yl, 2,3-dimethyl-4-stearyloxybut-1-yl, 3-stearyloxy-2,2-dimethylprop-1-yl, 2-(3'-heptanoyloxy)-2-methylhept-6-yl, 6-(2'-ethylhexanonyloxy)-6-methylhept-2-yl, 2-stearyloxy-2-methylhept-6-yl, 4-acryloyloxybut-2-yl, 2,3-dimethyl-4-methacryloyloxybut-1-yl, 4-acryloyloxybut-1-yl, 4-methacryloyloxybut-1-yl, 4-(tricyclododecylcarbonyloxy)-but-2-yl, 3-stearyloxyprop-2-yl, 4-methacryloyloxybut-2-yl and 4-(tricyclododecylcarbonyloxy)-prop-2-yl, (3) 2-cyclohexylethyl, pinan-3-ylmethyl, cyclohexylmethyl and bicyclohept-2-ylmethyl, (4a) unsubstituted or alkyl-substituted $C_5$–$C_{18}$-cycloalkyl: 2,6-diisopropylcyclohexyl, 2,6- and 3,5-dimethylcyclohexyl, 4-methylcyclohexyl, 2,4,6-trimethylcyclohexyl, 3,3,5-trimethylcyclohexyl, pinanyl, campheryl, norbornyl, bicyclo[2,2,2]octyl, tricyclo[5,2,1,0]decyl and cyclooctyl, and (4b) $C_5$–$C_{18}$-cycloalkyl which is substituted by carboalkoxy or trifluoromethyl: 1-carboethoxycyclohex-2-yl, 1-carbomethoxycyclohex-2-yl, and 2,6-ditrifluoromethylcyclohex-1-yl.

For reasons relating to the performance characteristics, particularly preferred radicals R and $R^1$ from amongst those stated above are $C_4$–$C_{18}$-alkyl, in particular the radicals stated under (1a), and 3-(2'-ethylhexyloxy)-prop-1-yl, 6-(2'-ethylhexanonyloxy)-6-methylhept-2-yl, 2,6- and 3,5-dimethylcyclohexyl, 2,6-diisopropylcyclohexyl, 4-methylcyclohexyl, 2,4,6-trimethylcyclohexyl, norbornyl and tricyclo[5,2,1,0]decyl, and n is 3 or 4, in particular 4.

Very particularly preferred diimides of the formula II are those in which R and $R^1$ have the above meanings. Among these diimides, noteworthy ones are those of the formula II where R and $R^1$ are linear $C_4$–$C_{13}$-alkyl, 4-methylcyclohexyl or norbornyl.

The present invention furthermore relates to novel perylene-3,4,9,10-tetracarboxylic acid diimides of the formula

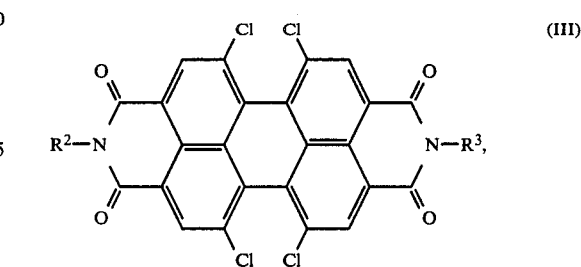

where $R^2$ and $R^3$ are each 3-(2'-ethylhexyloxy)-propyl, 2-ethylhexyl, butyl, octyl, tridecyl, octadecyl, pinan-3-ylmethyl, 6-(2'-ethylhexyanoyloxy)-6-methylhept-2-yl, 4-methylcyclohexyl, 3,5-dimethylcyclohexyl, 2,6-dimethylcyclohexyl, 2,6-diisopropylcyclohexyl or norbornyl, or $R^2$ is $C_4$–$C_{12}$-alkyl, $C_1$–$C_4$-alkyl-substituted cyclohexyl, or cyclohexyl-$C_1$–$C_2$-alkyl and $R^3$ is 2-hydroxyethyl, $C_1$–$C_{19}$-alkylcarbonyloxy-$C_2$–$C_4$-alkyl, $C_6$–$C_{12}$-cycloalkylcarbonyloxy-$C_2$–$C_4$-alkyl or $C_2$–$C_4$-alkenylcarbonyloxy-$C_2$–$C_4$-alkyl.

The perylimides of the formula I which are used according to the invention are prepared by chlorinating the corresponding perylimides (I) in which n is 0 with sulfuryl chloride in an inert organic solvent at from 35° to 95° C., preferably from 40° to 85° C., in the presence of a catalyst. Suitable catalysts are iodine and iodobenzene, in particular a mixture of these.

Examples of suitable inert organic liquids for the chlorination are chloroform, trichlorobenzene and, in particular, nitrobenzene.

When the chlorination is complete, the product is precipitated from the reaction mixture by adding a liquid which is miscible with the inert liquid but in which the product is insoluble, and the latter is isolated in a conventional manner. The products are obtained in very pure form, give fluorescent yellow colorations in polymers, and can also be used as intermediates for the preparation of other fluorescent dyes.

When intended for use in light-collecting systems, the products are, as a rule, purified further and, if required, separated into the individual components, for example by fractional precipitation from concentrated sulfuric acid, by recrystallization from readily removable, high boiling solvents or by boiling up with solvents under milling conditions. Purification can also be carried out by a chromatographic method under atmospheric or superatmospheric pressure.

If required, the purification procedures are repeated once or several times and/or various purification methods are combined in order to obtain very pure compounds (I).

In contrast to the prior art, very pure perylimide isomers, for example those of the formula III, can be obtained even by, for example, simple chromatographic separation methods. These isomers give extremely brilliant colorations and exhibit improved separation of the absorption and emission bands. Furthermore, even the perylimides (II) possessing small radicals R surprisingly are highly soluble in the media used.

Because it is even possible to employ radicals R which are sterically bulky but sensitive, the solubility of the diimides can be controlled over a range which it has not been possible to achieve to date.

In order to use the compounds (I), they are incorporated into plastics (media) suitable for the particular application. To do this, the plastic, in the form of granules, is powdered with the required amount of (I), and the granules are then extruded to give sheet-like structures. It is also possible to produce sheet-like structures colored with (I) by dipping the sheet-like structure into a solution of (I), (I) diffusing into the plastic. Another possible method comprises polymerizing the (I)-containing monomers or monomer mixtures to give a plastic.

Examples of plastics (media) which can be used for concentrating light for solar cells are polymethyl methacrylate, polymethyl acrylate, polystyrene, polydiethyleneglycol diallyl biscarbonate and other suitable nylons and polycarbonates.

The Examples which follow illustrate the invention. Parts and percentages are by weight.

EXAMPLE 1

(a) 13 parts of di-n-butylperylene-3,4,9,10-tetracarboxylic acid diimide, 1 part of iodine and 1 part of iodobenzene in 100 parts of nitrobenzene are initially taken, 21 parts of sulfuryl chloride are added dropwise at from 80° to 85° C. in the course of 2 hours, and the mixture is then stirred for a further 8 hours. The product is precipitated by adding 500 parts of methanol, and is filtered off under suction, washed and dried. 15 parts of tetrachloroperylimide of the formula I, where R and $R^1$ are each n—$C_4H_9$ and n is 4, are obtained.

M.p.: 300° C.

Cl content: calculated: 21.9%; $C_{32}H_{22}Cl_4N_2O_4$. found: 21.7%; (molecular weight 640.1).

(MS) $M^+$: 638.

(b) By recrystallization from o-dichlorobenzene with the addition of active carbon, 8 parts of the tetrachloro compound of the formula II, where R and $R^1$ are each n—$C_4H_9$, are obtained in the quality required for use in fluorescent collectors.

(c) 0.01 part of the dye is incorporated into 1000 parts of polymethyl methacrylate. The resulting coloration has an absorption maximum at 515 nm and an emission maximum (fluorescence maximum) at 551 nm. The fluorescent quantum efficiency is 95%.

EXAMPLES 2 TO 25

Chlorinated perylimides of the formula (I) are prepared as described in Example 1.

R and $R^1$ and the number of chlorine atoms (n) are given in columns 2 and 3, respectively, of the Table below. The amount of sulfuryl chloride used for the preparation is shown in column 4.

The products are purified by crystallization from a suitable organic solvent, eg. a chlorobenzene, an alkylbenzene, a halomethane, glacial acetic acid, dimethylformamide or a cycloalkane, or by chromatography over silica gel under superatmospheric pressure.

TABLE

| Example | R = $R^1$ | Cl n | Parts of $SO_2Cl_2$ per part of perylimide | Cl analysis calculated | Cl analysis found |
|---|---|---|---|---|---|
| 2 | (norbornyl structure) | 4 | 3 | 19.5 | 19.5 |
| 3 | " | 3 | 1.5 | 15.5 | 15.2 |
| 4 | " | 1 | | | |
| 5 | " | 2 | 0.5 | 10.6 | 10.9 |
| 6 | —$C_{18}H_{37}$ | 4 | 2 | 16.2 | 16.7 |
| 7 | —$C_8H_{17}$ | 2 | | | |
| 8 | " | 4 | 1.5 | 18.9 | 18.8 |
| 9 | " | 3 | 1.0 | 14.8 | 14.3 |
| 10 | —$CH_2$—(methyl-bicyclic) | 4 | 3 | 17.2 | 16.8 |
| 11 | 2,6-diisopropylphenyl | 4 | 2 | 16.5 | 16.8 |
| 12 | —$C_6H_{13}$ | 3 | 1 | 16.0 | 15.4 |
| 13 | 4-methylphenyl | 2 | 0.6 | 10.9 | 10.9 |

TABLE-continued

| Example | R = R¹ | Cl n | Parts of SO₂Cl₂ per part of perylimide | Cl analysis calculated | found |
|---|---|---|---|---|---|
| 14 | " | 3 | 2 | 15.5 | 15.5 |
| 15 | " | 4 | 4 | 19.2 | 18.9 |
| 16 | H₃C—⟨cyclohexyl-H⟩—H₃C (2,6-dimethylcyclohexyl) | 4 | 2 | 19.3 | 19.7 |
| 17 | —⟨cyclohexyl-H⟩ with CH₃, CH₃, CH₃ substituents | 2 | 0.5 | 9.4 | 10.1 |
| 18 | —CH₂—CH(C₂H₅)(C₄H₉(n)) | 4 | 0.9 | 18.2 | 18.7 |
| 19 | " | 3 | 0.5 | 17.8 | 15.0 |
| 20 | —CH(CH₂)₃—C(CH₃)₂—O—C(=O)—CH(C₂H₅)(C₄H₉(n)) with CH₃ | 4 | | 15.1 | 15.5 |
| 21 | —CH(CH₃)(CH₂)₂—O—C(=O)—(tricyclic group) | 3 | 1 | 11.2 | 12.5 |
| 22 | —(CH₂)₃O—CH₂—CH(C₄H₉)(C₂H₅) | 4 | 2 | 16.4 | 16.7 |
| 23 | —⟨cyclohexyl-H⟩ with CH₃, CH₃ (2,4-dimethylcyclohexyl) | 4 | 2 | 19.0 | 19.2 |
| 24 | —C₁₃H₂₇ | 2 | 0.5 | 8.6 | 8.9 |
| 25 | " | 4 | 1 | 15.9 | 15.7 |

EXAMPLE 26

(a) 15 parts of N-(2'-hydroxyethyl)-N'-octylperylene-3,4,9,10-tetracarboxylic acid diimide, 1 part of iodine and 1 part of iodobenzene in 120 parts of nitrobenzene are initially taken, 20 parts of sulfuryl chloride are added dropwise at from 80° to 85° C. in the course of 4 hours, while stirring, and the mixture is then stirred for a further 8 hours at this temperature. The product is precipitated by adding 1000 parts of methanol, and is filtered off under suction, washed and dried. 14 parts of chloroperylimide are obtained.

(b) By means of chromatography over silica gel under superatmospheric pressure using a 9:1 (v/v) 1,1,1-trichloroethane/petroleum ether mixture as the eluent, 8 parts of tetrachloroperylimide of the formula

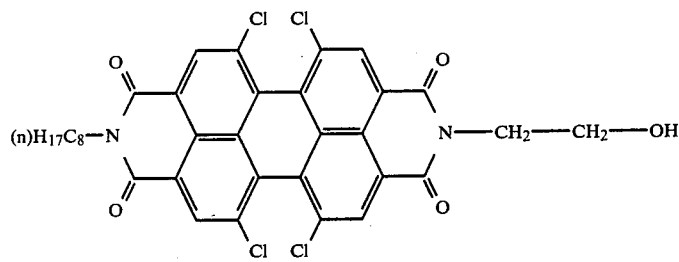

are isolated.

M.p.: >300° C.
$C_{34}H_{26}O_5N_2$; $Cl_4$; M.684.
Cl calculated 20.7; found 20.5%.

(c) By reacting the 2-hydroxyethylimide from (b) with 2-ethylhexanoyl chloride in the presence of pyridine, the perylimide of the formula

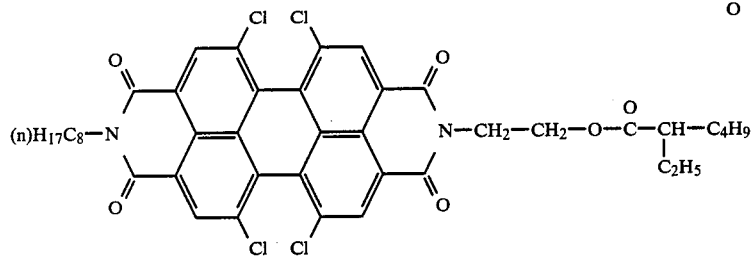

is obtained. In polymethyl methacrylate, this perylimide has an absorption maximum at 519 nm and an emission maximum at 560 nm. The fluorescent quantum efficiency is 83%.

The N-hydroxyethyl-N'-octyldiimide used in (a) is obtained by reacting N-octylperylenetetracarboxylic acid monoimide with ethanolamine. The monoimide is prepared from perylenetetracarboxylic acid and n-octylamine using the method described in EP-A 39 482.

EXAMPLES 27 TO 32

Perylimides of the formula are prepared by a method similar to that described in Example 26. $R^2$ and $R^3$ have the meanings shown in the Table below, and X is chlorine or hydrogen. The number of chlorine atoms (n) is shown in column 4 of the Table below, and the remaining radicals X are each hydrogen.

| | | | Cl n | Parts of Parts of $SO_2Cl_2$ | Cl analysis calculated (%) | found (%) |
|---|---|---|---|---|---|---|
| Example | $R^2$ | $R^3$ | | | | |
| 27 | —$C_8H_{17}$(n) | ⟨H⟩—$CH_3$ | 2 | 0.5 | 10.6 | 10.7 |
| 28 | —$C_4H_9$(n) | ⟨H⟩—$CH_3$ | 4 | 2.0 | 20.8 | 20.3 |
| 29 | —$C_4H_9$(n) | —$(CH_2)_2$—O—C(=O)—C(CH_3)=CH_2$ | 2 | 1.0 | 11.3 | 11.1 |
| 30 | ⟨H⟩—$CH_3$ | —CH(CH_3)(CH_2)_2$—OC(O)—$(CH_2)_{16}$—$CH_3$ | 3 | 0.5 | 11.5 | 11.2 |

-continued

| Example | R² | R³ | Cl n | Parts of Parts of SO₂Cl₂ | Cl analysis calculated (%) | found (%) |
|---|---|---|---|---|---|---|
| 31 | −(CH₂)₂−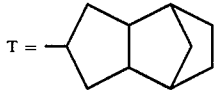H | −CH(CH₃)−(CH₂)₂−O−C(O)−C(CH₃)=CH₂ | 4 | 1.5 | 18.2 | 17.8 |
| 32 | −C₄H₉(n) | −CH(CH₃)−(CH₂)₂−O−C(O)−T | 2 | 0.8 | 9.5 | 9.9 |

T = 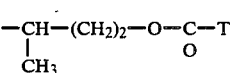

We claim:

1. A perylene-3,4,9,10-tetracarboxylic acid diimide of the formula

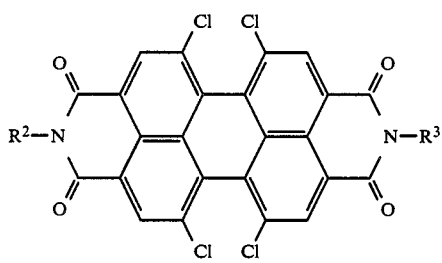

where $R^2$ and $R^3$ are each 3-(2'-ethylhexyloxy)-propyl or 6-(2'-ethylhexanoyloxy)-6-methylhept-2-yl.

2. A perylene-3,4,9,10-tetracarboxylic acid diimide of the formula

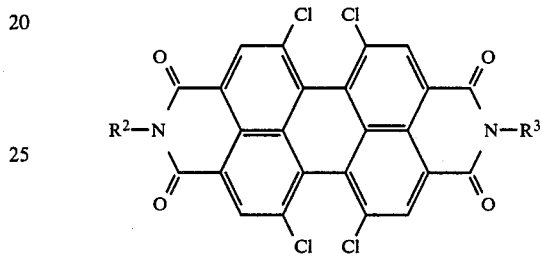

where $R^2$ is $C_1$–$C_4$ alkyl-substituted cyclohexyl or cyclohexyl-$C_1$- or $C_2$-alkyl and $R^3$ is 2-hydroxyethyl, $C_1$–$C_{19}$-alkylcarbonyloxy-$C_2$–$C_4$-alkyl, $C_6$–$C_{12}$-cycloalkylcarbonyloxy-$C_2$–$C_4$-alkyl, or $C_2$–$C_4$-alkenylcarbonyloxy-$C_2$–$C_4$-alkyl.

3. A perylene-3,4,9,10-tetracarboxylic acid diimide of the formula

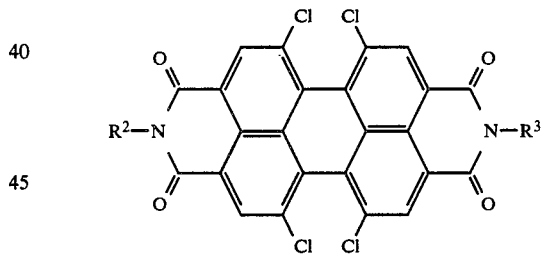

where $R^2$ is $C_4$–$C_{12}$ alkyl, and $R^3$ is 2-hydroxyethyl, $C_1$–$C_{19}$-alkylcarbonyloxy-$C_2$–$C_4$-alkyl, $C_6$–$C_{12}$-cycloalkylcarbonyloxy-$C_2$–$C_4$-alkyl, or $C_2$–$C_4$-alkenylcarbonyloxy-$C_2$–$C_4$-alkyl.

* * * * *